US007839197B2

(12) United States Patent
Chen et al.

(10) Patent No.: US 7,839,197 B2
(45) Date of Patent: Nov. 23, 2010

(54) LEVEL SHIFT CIRCUIT

(75) Inventors: An-Tung Chen, Pingjen (TW); Li-Wen Fang, Taipei (TW); Hung-Der Su, Jhudong Township, Hsinchu County (TW)

(73) Assignee: Richtek Technology Corp., Hsinchu (TW)

( * ) Notice: Subject to any disclaimer, the term of this patent is extended or adjusted under 35 U.S.C. 154(b) by 20 days.

(21) Appl. No.: 12/230,953

(22) Filed: Sep. 9, 2008

(65) Prior Publication Data

US 2009/0066399 A1 Mar. 12, 2009

(30) Foreign Application Priority Data

Sep. 11, 2007 (TW) .............................. 96133853 A

(51) Int. Cl.
*H03L 5/00* (2006.01)
(52) U.S. Cl. ............................ 327/333; 326/68; 326/81
(58) Field of Classification Search ................... 326/62, 326/63, 68, 80, 81; 327/333
See application file for complete search history.

(56) References Cited

U.S. PATENT DOCUMENTS

| 5,528,173 | A | * | 6/1996 | Merritt et al. | 326/80 |
| 6,184,716 | B1 | * | 2/2001 | Depetro et al. | 326/83 |
| 6,946,893 | B2 | * | 9/2005 | Hayashi et al. | 327/333 |
| 6,985,022 | B2 | * | 1/2006 | Kanno et al. | 327/333 |
| 7,317,335 | B2 | * | 1/2008 | Min et al. | 326/81 |
| 7,352,229 | B1 | * | 4/2008 | Mei et al. | 327/333 |
| 7,372,314 | B2 | * | 5/2008 | Hirano | 327/333 |
| 7,463,078 | B2 | * | 12/2008 | Xu | 327/333 |
| 2005/0007176 | A1 | * | 1/2005 | Seki | 327/333 |
| 2005/0231260 | A1 | * | 10/2005 | Srinivas et al. | 327/333 |
| 2006/0290404 | A1 | * | 12/2006 | Law | 327/333 |
| 2008/0116954 | A1 | * | 5/2008 | Lin et al. | 327/333 |

* cited by examiner

*Primary Examiner*—Lincoln Donovan
*Assistant Examiner*—William Hernandez
(74) *Attorney, Agent, or Firm*—Rosenberg, Klein & Lee

(57) ABSTRACT

A level shift circuit includes an input stage and an output stage coupled to each other by two nodes. The input stage changes the voltages on the nodes according to an input signal, and the output stage determines an output signal according to the voltages on the two nodes. In a transition state, the input stage provides a large current to charge or discharge the first node or the second node so as to quickly change the voltage thereon. In a steady state, the input stage lowers the current so as to reduce power consumption.

10 Claims, 8 Drawing Sheets

LEVEL SHIFT CIRCUIT

FIELD OF THE INVENTION

The present invention is related generally to a level shift circuit and, more particularly, to a less power consumption level shift circuit.

BACKGROUND OF THE INVENTION

A level shift circuit is a device to shift the level of a signal from low voltage to high voltage or vice versa. For example, FIG. 1 shows a conventional level shift circuit 10 to shift a signal from low voltage to high voltage, which includes an input stage 12 and an output stage 14 coupled to each other by nodes N1 and N2: The high level and low level of the input signal VIN are voltages VP1 and VS1, respectively, and after level shift, the high level and low level of the output signal VOUT are voltages VP2 and VS2, respectively. In the input stage 12, when the input signal VIN transits to its high level VP1, an NMOS transistor M5 is turned on and another NMOS transistor M6 is turned off, and consequently the node N1 is electrically connected to a voltage source VS1 and a current I1 is produced to discharge the node N1, thereby pulling down the voltage on the node N1 to a low level. When the voltage on the node N1 transits to the low level, a PMOS transistor M2 is turned on so as to electrically connect the node N2 to a voltage source VP2 and thereby pull high the voltage on the node N2 to the voltage VP2. When the input signal VIN transits to the low level VS1, the NMOS transistor M5 is turned off and the NMOS transistor M6 is turned on, so that the node N2 is electrically connected to the voltage source VS1 and a current I2 is produced to discharge the node N2, thereby pulling down the voltage on the node N2 to a low level. As a result, a PMOS transistor M1 is turned on and thus the node N1 is electrically connected to the voltage source VP2 to pull high the voltage on the node N1 to the voltage VP2. Two high-voltage transistors M3 and M4 are used to prevent excessively large voltage differences between the voltage source VP2 and the nodes N1 and N2, respectively, that may damage the transistors M1 and M2.

In the output stage 14, PMOS transistors M7 and M8 are controlled by the voltages on the nodes N2 and N1, respectively. When the input signal VIN is on the high level VP1, the voltage on the node N1 is at a low level and the voltage on the node N2 is at a high level. Consequently, the PMOS transistor M7 is turned off and the PMOS transistor M8 is turned on, so that a node N4 is electrically connected to the voltage source VP2, and thereby the output signal VOUT will be the voltage VP2. When the input signal VIN is at the low level VS1, the voltage on the node N1 is at a high level and the voltage on the node N2 is at a low level. Consequently, the PMOS transistor M7 is turned on and the PMOS transistor M8 is turned off, so that a node N3 is electrically connected to the voltage source VP2. As a result, an NMOS transistor M10 is turned on to electrically connect the node N4 to a voltage source VS2 and thereby the output signal VOUT will be the voltage VS2.

Since the transistors M3, M4, M5 and M6 in the level shift circuit 10 are all high-voltage devices and thus have large parasitic capacitances, the charge and discharge processes of the nodes N1 and N2 will take very long time. This not only weakens the driving capability of the circuit, but also results in very slow level shift. Moreover, because of the two additional high-voltage PMOS transistors M3 and M4, the level shift circuit 10 has the difficulty with low-voltage applications, which are referred to the applications with small difference between the voltages VP2 and VS1. Hence, if fewer high-voltage transistors are used, the layout will be smaller and the parasitic capacitances will be reduced. Consequently, the driving capability will be improved and the level shift speed is enhanced. Also, low-voltage applications of the circuit are facilitated.

FIG. 2 shows another conventional level shift circuit 20. In the input stage 22 thereof, NMOS transistors $MN_1$ and $M'N_1$ are controlled by input signals $S_L$ and $S'L$, respectively, where the signals $S_L$ and $S'_L$ are opposite in phase to each other. When the signal $S_L$ is high and the signal $S'_L$ is low, the NMOS transistor $MN_1$ is turned on to produce a discharge current I1 so as to pull down the voltage on a node $S'_H$ to a low level, and thereby a PMOS transistor $M'P_2$ is turned on to pull high the voltage on a node $S_H$ to a high level. When the signal $S_L$ is low and the signal $S'_L$ is high, the NMOS transistor $M'N_1$ is turned on to produce a discharge current I2 so as to pull down the voltage on the node $S_H$ to a low level. As a result, a PMOS transistor MP2 is turned on to pull high the voltage on the node $S'_H$ to a high level. PMOS transistors $MP_1$ and $M'P_1$ are configured as diodes so as to prevent excessively large voltage differences between the voltage source $V_{DDH}$ and the nodes $S'_H$ and $S_H$, respectively. The output stage 24 of the level shift circuit 20 includes serially connected PMOS transistor $MP_3$ and NMOS transistor $MN_2$ controlled by the voltage on the node $S'_H$ and the input signal $S'_L$, respectively. When the signal $S_L$ is high and the signal $S'_L$ is low, the voltage on the node $S'_H$ is low, and thus the transistor $MP_3$ is turned on and the transistor $MN_2$ is turned off, thereby asserting a high-level output signal Vout. When the signal $S_L$ is low and the signal $S'_L$ is high, the voltage on the node $S'_H$ is high, and the transistor $MP_3$ is turned off and the transistor $MN_2$ is turned on, thereby asserting a low-level output signal Vout.

In the level shift circuit 20, by using the concept of voltage mirror, the voltage differences between the voltage source $V_{DDH}$ and the nodes $S_H$, $S'_H$ are small, and there is thus no need of the high-voltage transistors M3 and M4 in the level shift circuit 10. Therefore, the level shift circuit 20 has less parasitic capacitances and implements quicker level shift. During the transition state where the voltages on the nodes $S_H$ and $S'_H$ transit from high to low, to enhance the driving capability of the voltage mirror to speed up the level shift, the discharge currents I1 and I2 must be large. However, during the steady state where the voltages on the nodes $S_H$ and $S'_H$ are remained at high or low, the large currents I1 and I2 will consume much power. If the currents I1 and I2 are decreased for power saving, the driving capability of the voltage mirror will be significantly degraded and the level shift speed will be lowered.

Therefore, it is desired a power saving, high driving capability level shift circuit.

SUMMARY OF THE INVENTION

An object of the present invention is to provide a quick level shift circuit.

Another object of the present invention is to provide a level shift circuit requiring fewer high-voltage transistors so as to reduce the layout thereof.

A further object of the present invention is to provide a less power consumption level shift circuit.

According to the present invention, a level shift circuit has an input stage and an output stage coupled to each other by two nodes. During a transition state, the input stage turns on a large current to charge or discharge the first node or the second node so as to quickly change the voltage thereon, and in a steady state, the input stage limits the current to be small so as to reduce power consumption. The output stage asserts an output signal according to the voltages on the first and second nodes.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 3:
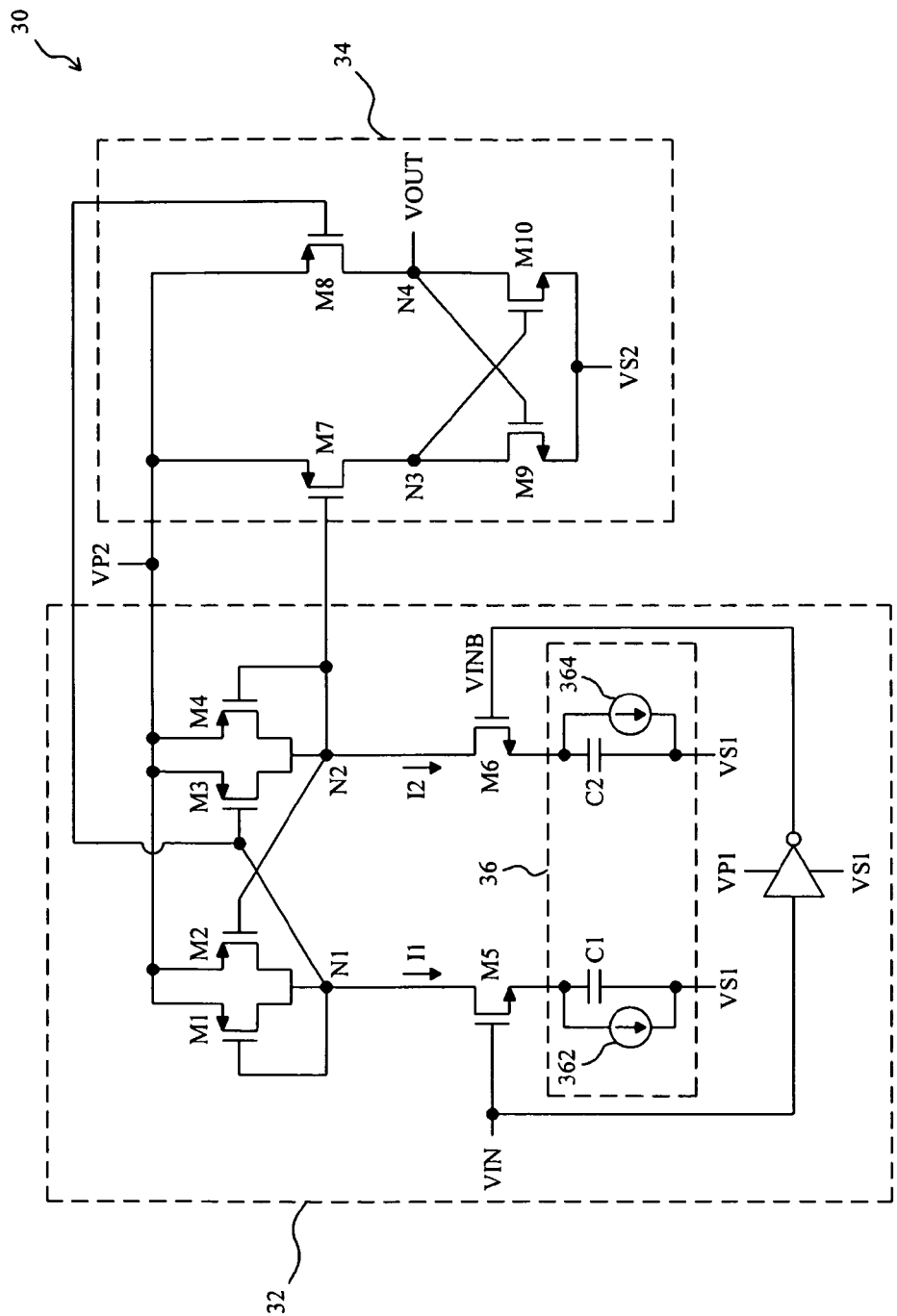
FIG. 3 a circuit diagram of a level shift circuit according to a first embodiment of the present invention.

FIG. 3 shows a first embodiment according to the present invention, in which a level shift circuit 30 includes an input stage 32 and an output stage 34 coupled together by nodes N1 and N2. The high level and low level of the input signal VIN are voltages VP1 and VS1, respectively, and after level shift, the high level and low level of the output signal VOUT are voltages VP2 and VS2, respectively. The input stage 32 has PMOS transistors M1, M2, M3 and M4, NMOS transistors M5 and M6, and a current control circuit 36 configured to change the voltages on the nodes N1 and N2 according to the input signal VIN. The transistor M1 is configured as a diode connected in parallel with the transistor M2 between a voltage source VP2 and the node N1, and the transistor M4 is configured as another diode connected in parallel with the transistor M3 between the voltage source VP2 and the node N2. The transistor M5 is connected between the node N1 and the current control circuit 36 and is controlled by the input signal VIN, and the transistor M6 is connected between the node N2 and the current control circuit 36 and is controlled by a signal VINB that is opposite in phase to the input signal VIN. The transistors M1 and M4 configured as diodes serve as a voltage clamp circuit which will limits the voltage differences between the voltage source VP2 and the nodes N1 and N2, respectively, so as to prevent damages caused by excessively large voltage differences across the transistors M2 and M3. The current control circuit 36 has a capacitor C1 connected between the source of the transistor M5 and a voltage source VS1, a capacitor C2 connected between the source of the transistor M6 and the voltage source VS1, and small current sources 362 and 364 connected in parallel with the capacitors C1 and C2, respectively. The output stage 34 has a PMOS transistor M7 connected between the voltage source VP2 and a node N3, a PMOS transistor M8 connected between the voltage source VP2 and a node N4, an NMOS transistor M9 connected between the node N3 and a voltage source VS2, an NMOS transistor M10 connected between the node N4 and the voltage source VS2, and the transistors M7 and M8 are controlled by the voltages on the nodes N2 and N1, respectively.

In the circuit of FIG. 3, when the input signal VIN transits from the low level VS1 to the high level VP1, the transistor M5 is turned on and the transistor M6 is turned off. As a result, a large current I1 will flow through the transistor M5 to discharge the node N1 and charge the capacitor C1. Meanwhile, the current source 364 will discharge the capacitor C2 to the voltage source VS1. Since the current I1 is large, it quickly changes the voltage on the node N1. When the voltage on the node N1 transits to a low level, the transistor M3 is turned on to pull up the voltage on the node N2 to a high level so as to turn off the transistor M2. When the capacitor C1 is saturated, the current I1 will be limited by the small current source 362 so that the current I1 flowing through the transistor M5 is equal to the small current provided by the current source 362. Moreover, when the voltage on the node N1 transits to a low level and the voltage on the node N2 transits to a high level, the transistor M7 is turned off and the transistor M8 is turned on, so that the node N4 is electrically connected to the voltage source VP2 and the node N3 is electrically connected to the voltage source VS2, thereby asserting a high-level output signal VOUT which is equal to the voltage VP2.

When the input signal VIN transits from the high level VP1 to the low level VS1, the transistor M5 is turned off and the transistor M6 is turned on. As a result, a large current I2 flows through the transistor M6, and thereby discharges the node N2 and charges the capacitor C2. Meanwhile, the small current source 362 discharges the capacitor C1 to the voltage source VS1. When the voltage on the node N2 transits to a low level, the transistor M2 is turned on to pull high the voltage on the node N1 to a high level so as to turn off the transistor M3. When the capacitor C2 is saturated, the current I1 flowing through the transistor M6 will be limited by the small current source 364 so that the current I1 is equal to the small current provided by the current source 364. Moreover, when the voltage on the node N1 transits to a high level and the voltage on the node N2 transits to a low level, the transistor M7 is turned on and the transistor M8 is turned off, so that the node N3 is electrically connected to the voltage source VP2 and the node N4 is electrically connected to the voltage source VS2, thereby asserting a low-level output signal VOUT which is equal to the voltage VS2.

Since there are only two high-voltage transistors M5 and M6 in the level shift circuit 30, the parasitic capacitances on the nodes N1 and N2 are smaller than those of the conventional level shift circuit 10 requiring four high-voltage transistors. Thus, during the transition of the input signal VIN, the nodes N1 and N2 in the level shift circuit 30 are charged and discharged with higher speed, thereby speeding up the level shift. Besides, since the level shift circuit 30 has two high-voltage transistors less than the conventional level shift circuit 10, the level shift circuit 30 has a smaller layout.

Figure 1:
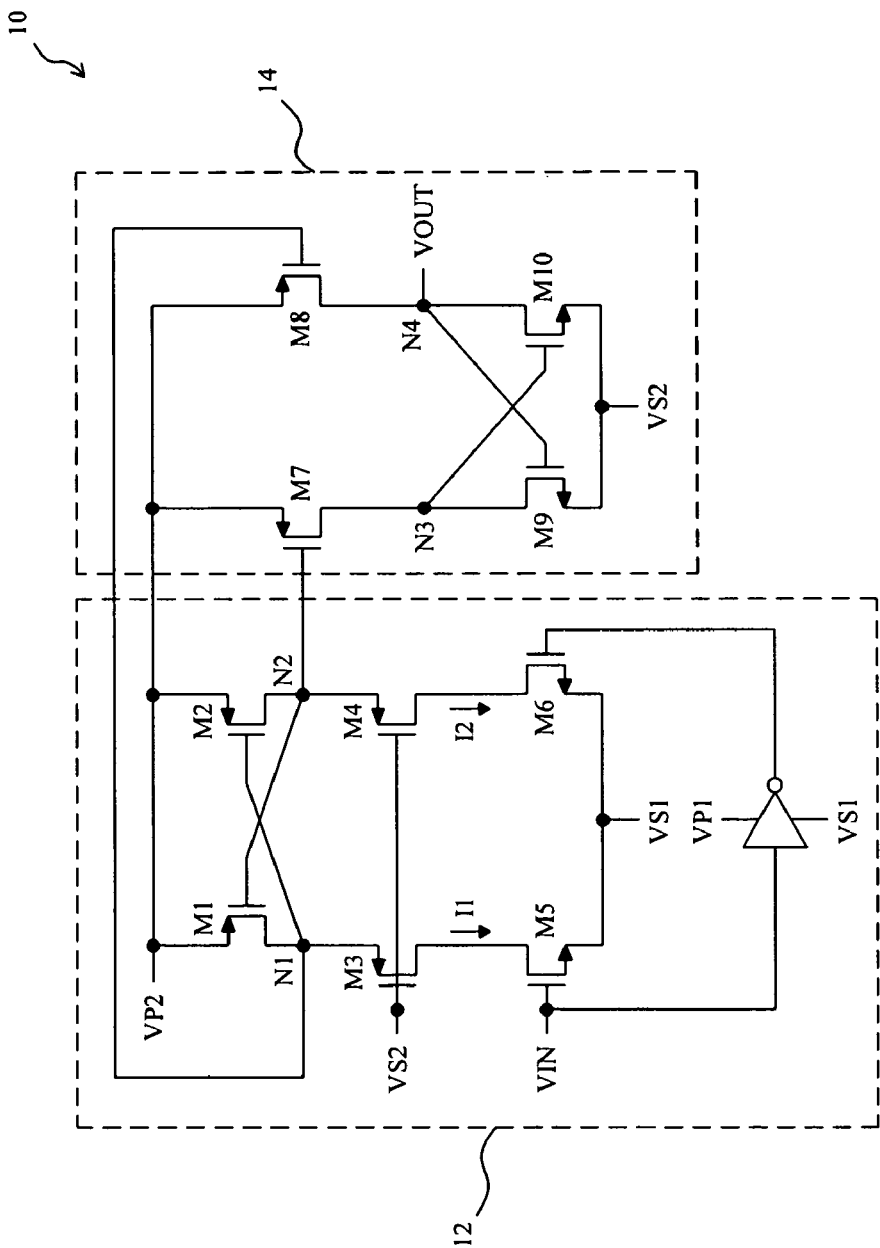
FIG. 1 is a circuit diagram of a conventional level shift circuit to shift a signal from low voltage to high voltage.
Figure 2:
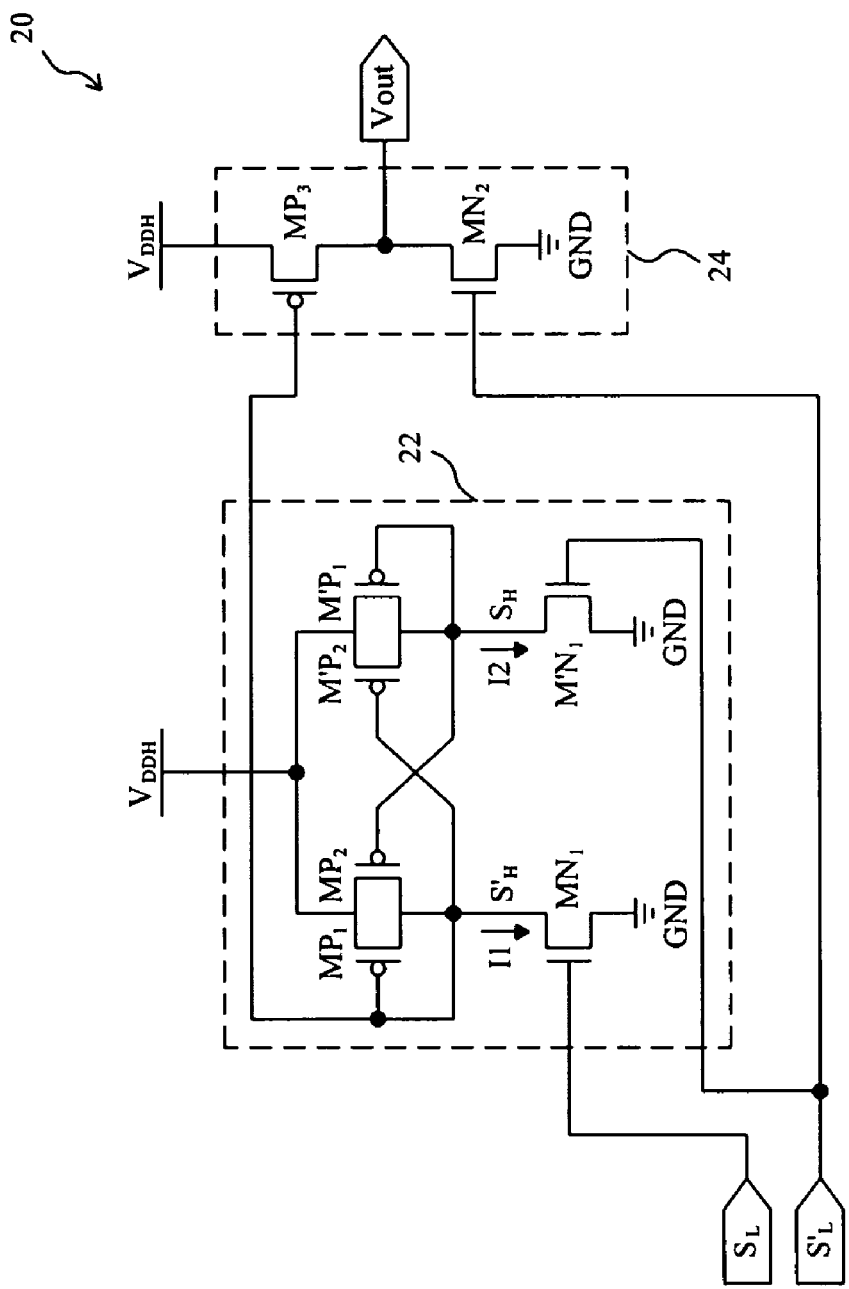
FIG. 2 is a circuit diagram of a conventional level shift circuit having high driving capability.

In comparison of the circuit 30 of FIG. 3 to the circuit 20 of FIG. 2, the high-voltage NMOS transistors $MN_1$ and $M'N_1$ constituting to a voltage mirror in the conventional level shift circuit 20 are replaced with the transistors M5 and M6 in the level shift circuit 30 that function as a pair of switches for the control of the capacitors C1 and C2 at their sources as well as the current sources 362 and 364. In the level shift circuit 30, during the transition state where the voltages on the nodes N1 and N2 transit from a high level to a low level or vice versa, the current I1 or I2 flowing through the transistor M5 or M6 is large so that the transition of the voltages on the nodes N1 and N2 are more quickly. When the capacitor C1 or C2 is saturated, the current source 362 or 364 will limit the current I1 or I2 to be small. By proper selection of the capacitances of the capacitors C1 and C2, it is possible to have the capacitor C1 or C2 no more than saturation when the voltages on the nodes N1 and N2 transit completely, so as to limit the current I1 or I2 to the small current. Therefore, during the steady state where the voltages on the nodes N1 and N2 are retained at a high level or a low level, the current I1 or I2 flowing through the transistor M5 or M6 is small. Hence, the level shift circuit 30 is superior to the conventional level shift circuit 20 in power saving.

Figure 4:
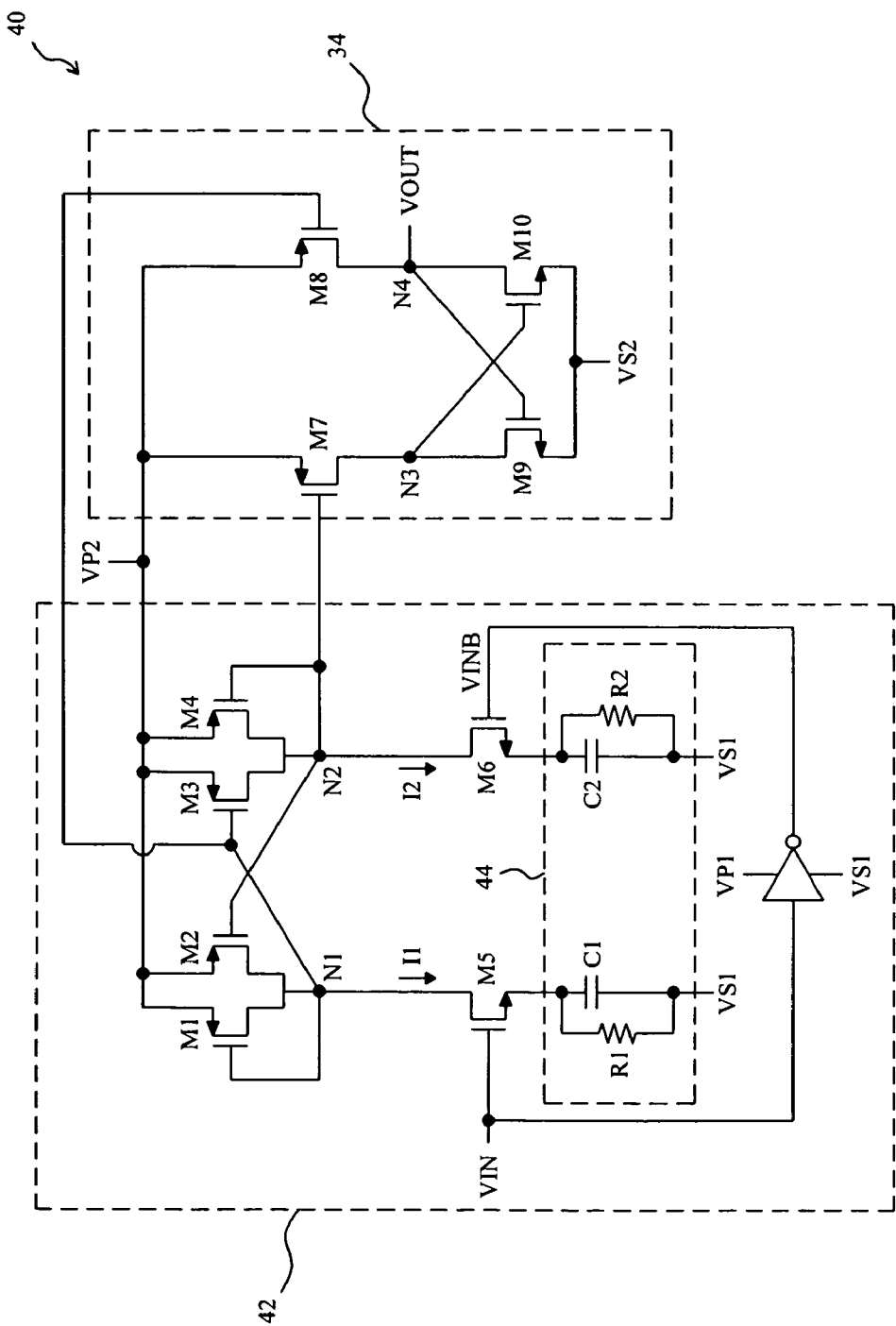
FIG. 4 a circuit diagram of a level shift circuit according to a second embodiment of the present invention.

FIG. 4 shows a second embodiment according to the present invention, in which a level shift circuit 40 includes an input stage 42 and an output stage 34 coupled to each other by nodes N1 and N2. The input stage 42 has transistors M1, M2, M3, M4, M5 and M6, and a current control circuit 44 configured to change the voltages on the nodes N1 and N2 according to an input signal VIN. In the current control circuit 44, a capacitor C1 is connected between the transistor M5 and a voltage source VS1, a capacitor C2 is connected between the transistor M6 and the voltage source VS1, and resistors R1 and R2 are connected in parallel with the capacitors C1 and C2, respectively. Similarly, during the transition state, since the current I1 or I2 flowing through the transistor M5 or M6 is large, the node N1 or N2 is discharged with high speed for quick level shift. In the steady state, when the capacitors C1 and C2 are fully charged by the currents I1 and I2, the resistors R1 and R2 will limit the currents I1 and I2 flowing through the transistors M5 and M6 to be small so as to reduce power consumption.

Figure 5:
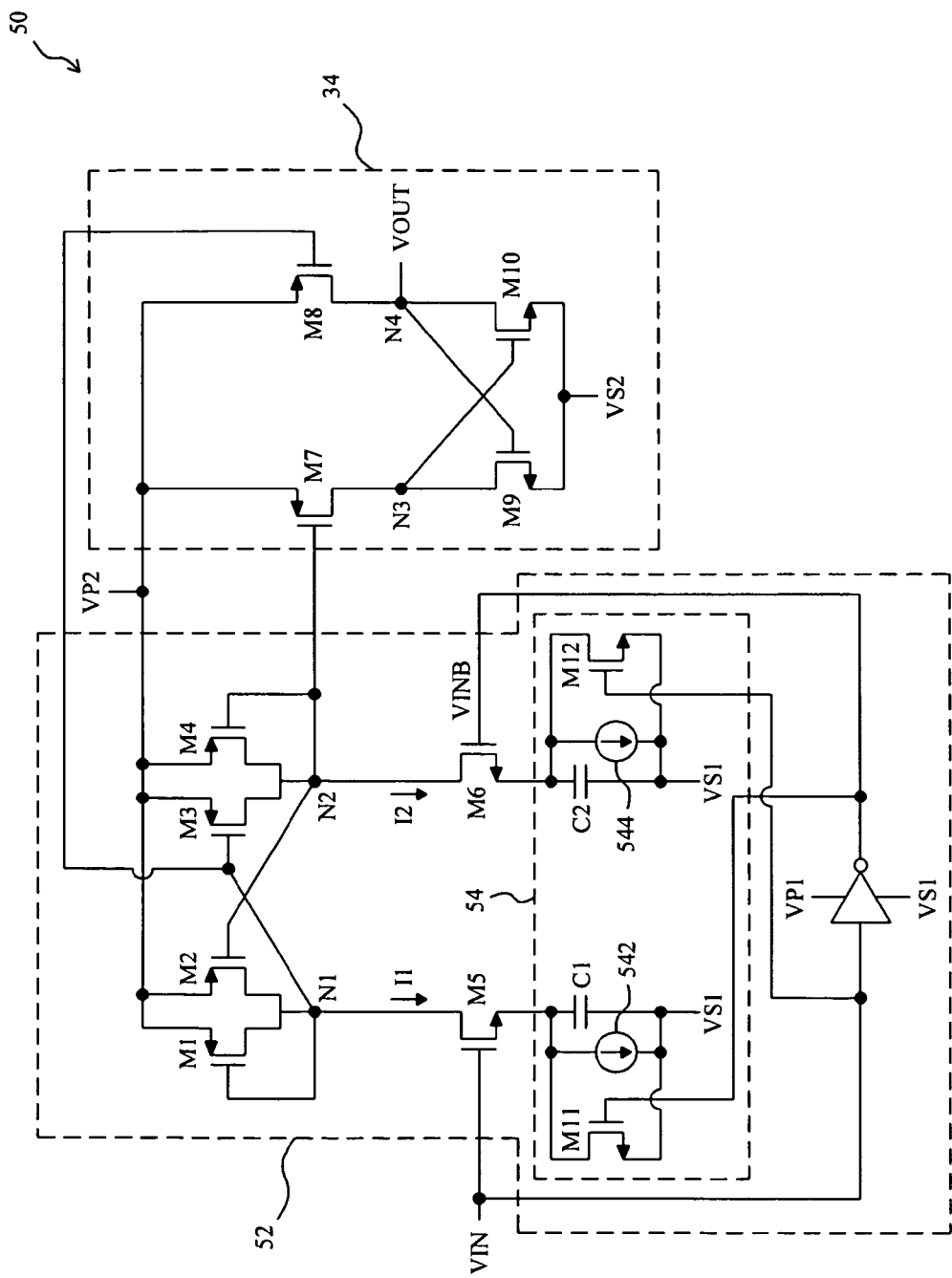
FIG. 5 a circuit diagram of a level shift circuit according to a third embodiment of the present invention.

In the third embodiment shown in FIG. 5, a level shift circuit 50 includes an input stage 52 and an output stage 34 coupled together by nodes N1 and N2. The input stage 52 has transistors M1, M2, M3, M4, M5 and M6, and a current control circuit 54 configured to change the voltages on the nodes N1 and N2 according to an input signal VIN. In the current control circuit 54, a capacitor C1 is connected between the transistor M5 and a voltage source VS1, a capacitor C2 is connected between the transistor M6 and the voltage source VS1, small current sources 542 and 544 are connected in parallel with the capacitors C1 and C2, respectively, and transistors M11 and M12 functioning as switches controlled by the input signal VIN are connected in parallel with the capacitors C1 and C2, respectively. When the input signal VIN transits to a low level, the transistor M5 is turned off and the transistor M6 is turned on, thereby turning on a large current I2 flows through the transistor M6 to discharge the node N2 and charge the capacitor C2. When the capacitor C2 is saturated, the small current source 544 will limit the current I2 to be small so as to reduce power consumption. When the input signal VIN transits to a high level, the transistor M5 is turned on and the transistor M6 is turned off, thereby turning on a large current I1 flows through the transistor M5 to discharge the node N1 and charge the capacitor C1. When the capacitor C1 is saturated, the small current source 542 will limit the current I1 to be small so as to reduce power consumption. During the transistor M5 is off, the small current source 542 discharges the capacitor C1 until the voltage on the capacitor C1 decreases to be the voltage VS1. However, if the input signal VIN is a high-frequency signal, the transistor M5 is possible to be turned on before the capacitor C1 is discharged to have the voltage VS1 thereon, since the small current source 542 only provides a small current. As a result, the current I1 may be limited before the voltage on the node N1 descends to a low level. To avoid this condition, a transistor M11 is connected in parallel with the capacitor C1 so that when the transistor M5 is off, the transistor M11 is on to establish a discharge path to quickly discharge the capacitor C1. Similarly, for the high frequency transition applications, a transistor M12 is connected in parallel with the capacitor C2 to quickly discharge the capacitor C2 when the transistor M6 is off.

Figure 6:
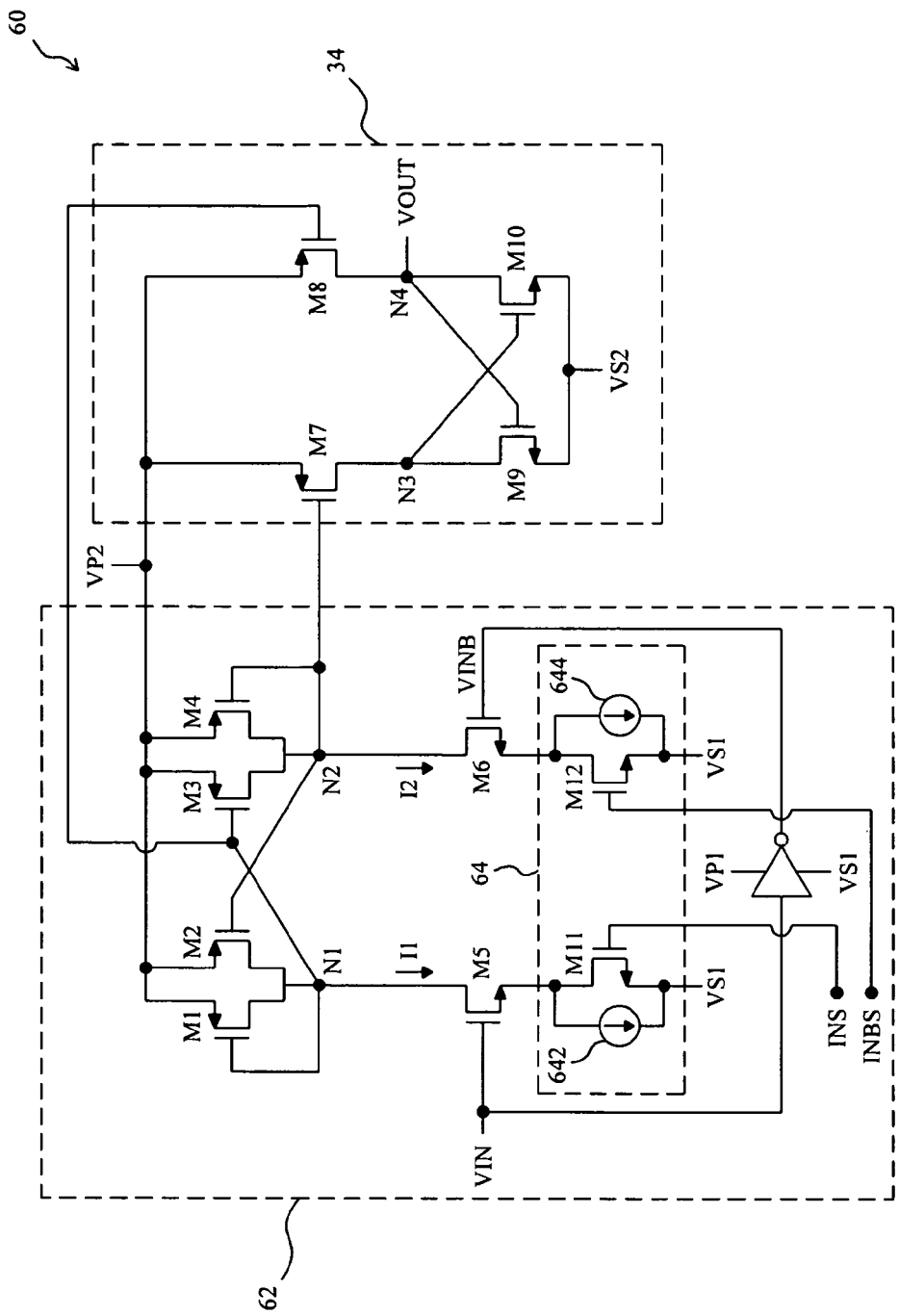
FIG. 6 a circuit diagram of a level shift circuit according to a fourth embodiment of the present invention.
Figure 7:
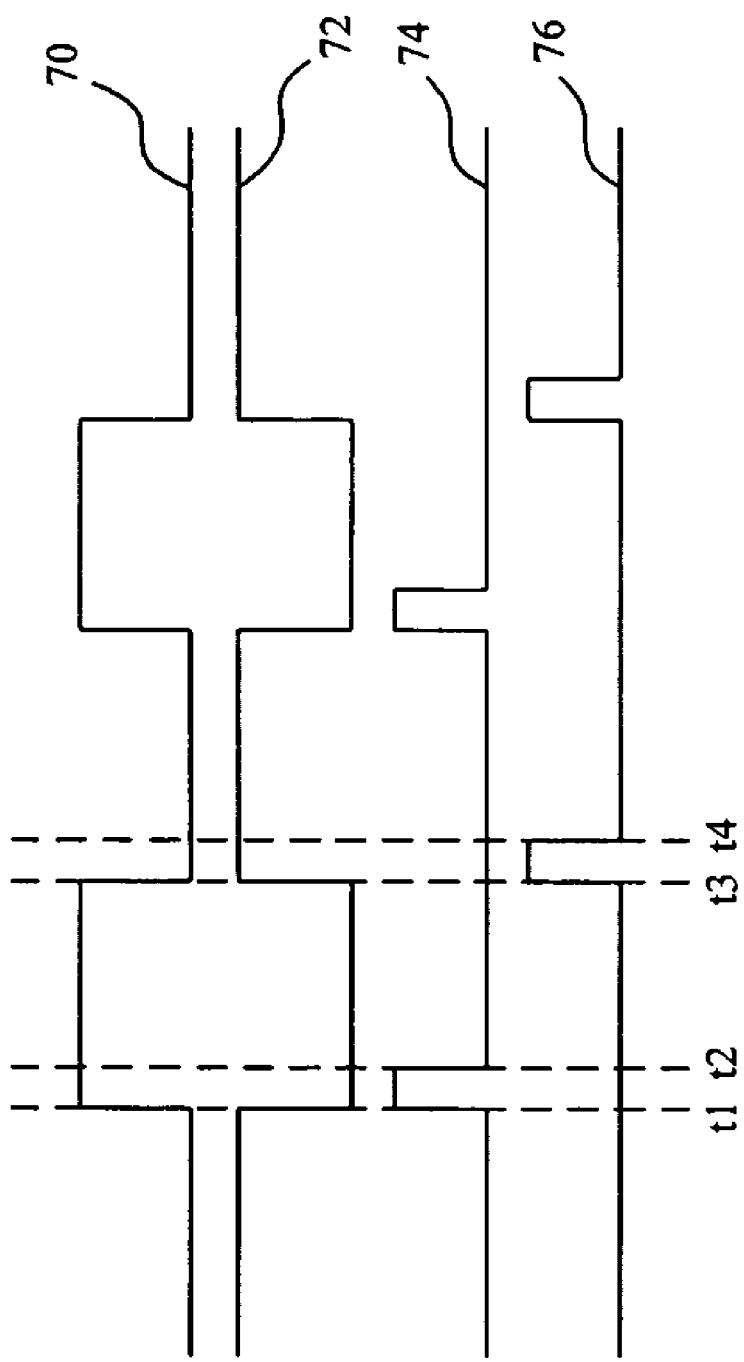
FIG. 7 a waveform diagram of corresponding signals in the circuit of FIG. 6.

FIG. 6 is a fourth embodiment, in which a level shift circuit 60 includes an input stage 62 and an output stage 34 coupled to each other by nodes N1 and N2. The input stage 62 has transistors M1, M2, M3, M4, M5 and M6, and a current control circuit 64 configured to change the voltages on the nodes N1 and N2 according to an input signal VIN. In the current control circuit 64, a transistor M11 is connected between the transistor M5 and a voltage source VS1 to function as a switch controlled by a signal INS, a transistor M12 is connected between the transistor M6 and the voltage source VS1 to function as a switch controlled by a signal INBS, and small current sources 642 and 644 are connected in parallel with the transistors M11 and M12, respectively. The signals INS and INBS are short pulses triggered by the signals VIN and VINB, respectively. FIG. 7 is a waveform diagram of corresponding signals in the circuit of FIG. 6, in which waveform 70 represents the input signal VIN, waveform 72 represents the signal VINB which is inverse to the input signal VIN, waveform 74 represents the signal INS triggered by the input signal VIN, and waveform 76 represents the signal INBS triggered by the signal VINB. Referring to FIGS. 6 and 7, when the input signal VIN transits to a high level, as shown at time 1, the transistor M5 is turned on and the transistor M6 is turned off. Meanwhile, the short pulse signal INS turns on the transistor M11 so as to connect the source of the transistor M5 to the voltage source VS1. Therefore, during the short pulse signal INS is asserted, i.e. from time t1 to time t2, a large current I1 flows through the transistor M5. When the signal INS transits to a low level, as shown at time t2, so as to turn off the transistor M11, the current I1 flowing through the transistor M5 will be limited by the small current source 642 to be small so as to reduce power consumption. When the input signal VIN transits to a low level, as shown at time t3, the transistor M5 is turned off and the transistor M6 is turned on. Meanwhile, the short pulse signal INBS turns on the transistor M12 to connect the source of the transistor M6 to the voltage source VS1. During the short pulse signal INBS is asserted, i.e. from time t3 to time t4, a large current I2 flows through the transistor M6. When the signal INBS transits to a low level, as shown at time t4, so as to turn off the transistor M12, the current I2 will be limited by the small current source 644 to be small so as to reduce power consumption. By proper selection of the periods of the short pulse signals INS and INBS, it is possible to remain the large currents I1 and I2 until the transition of the voltages on the nodes N1 and N2 are completed.

Figure 8:
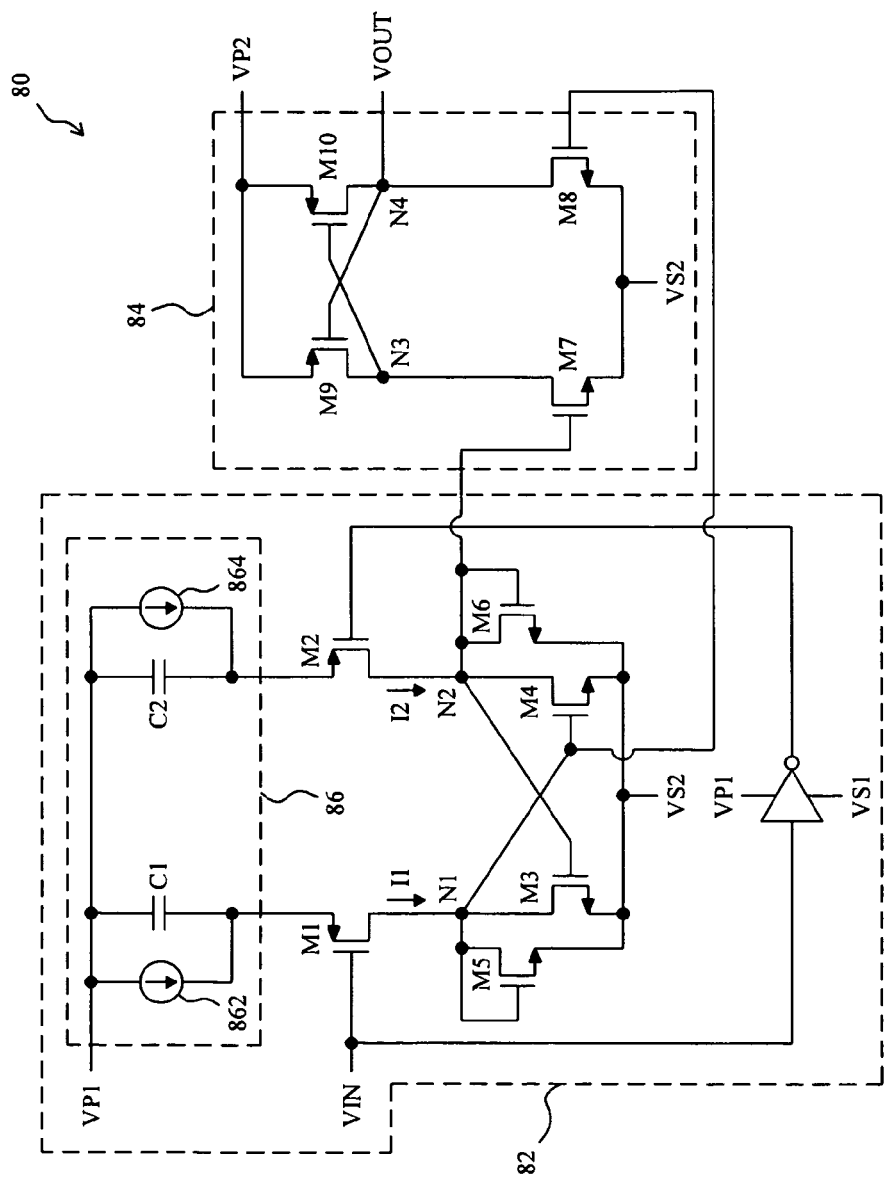
FIG. 8 a circuit diagram of a level shift circuit according to a fifth embodiment of the present invention.

The level shift circuit 80 shown in FIG. 8 includes an input stage 82 and an output stage 84 coupled to each other by nodes N1 and N2. As in the above embodiments, the high level and low level of the input signal VIN are voltages VP1 and VS1, respectively, and after level shift, the high level and low level of the output signal VOUT are voltages VP2 and VS2, respectively. However, this level shift circuit 80 is configured to shift a signal from high voltage to low voltage. In the input stage 82, a PMOS transistor M1 is connected between the node N1 and a current control circuit 86 and is controlled by the input signal VIN, a PMOS transistor M2 is connected between the node N2 and the current control circuit 86 and is controlled by a signal inverse to the input signal VIN, an NMOS transistor M3 is connected between the node N1 and a voltage source VS2 and is controlled by the voltage on the node N2, an NMOS transistor M4 is connected between the node N2 and the voltage source VS2 and is controlled by the voltage on the node N1, and transistors M5 and M6 are configured as diodes connected in parallel with the transistors M3 and M4, respectively, for limiting the voltage differences between the voltage source. VS1 and the nodes N1 and node N2, respectively. In the current control circuit 86, a capacitor C1 is connected between the source of the transistor M1 and a voltage source VP1, a capacitor C2 is connected between the source of the transistor M2 and the voltage source VP1, and small current sources 862 and 864 are connected in parallel with the capacitors C1 and C2, respectively. In the output stage 84, an NMOS transistor M7 is connected between a node N3 and a voltage source VS2 and is controlled by the voltage on the node N2, an NMOS transistor M8 is connected between a node N4 and the voltage source VS2 and is controlled by the voltage on the node N1, a PMOS transistor M9 is connected between a voltage source VP2 and the node N3 and is controlled by the voltage on the node N4, and a PMOS transistor M10 is connected between the voltage source VP2 and the node N4 and is controlled by the voltage on the node N3.

When the input signal VIN transit to a high level, the transistor M1 is turned off and the transistor M2 is turned on. At this time, the current source 862 charges the capacitor C1 so as to pull high the voltage on the source of the transistor M1 to the voltage VP1. When the transistor M2 is turned on, a large current I2 flows therethrough to charge the node N2 and discharge the capacitor C2. Since the current I2 is large, it will quickly change the voltage on the node N2. When the voltage on the node N2 transits to a high level, the transistor M3 is turned on to pull down the voltage on the node N1 to a low level, so as to turn off the transistor M4. When the charges on the capacitor C2 are fully discharged by the current I2, the current source 864 will limit the current I2 flowing through the transistor M2 to be small so as to reduce power consumption. Moreover, since the voltage on the node N1 is a low level and the voltage on the node N2 is a high level, the transistor M7 is turned on and the transistor M8 is turned off, so that the node N3 is connected to the voltage source VS2 and the node N4 is connected to the voltage source VP2, thereby asserting a high-level output signal VOUT.

When the input signal VIN transits to a low level, the transistor M1 is turned on and the transistor M2 is turned off. At this time, the current source 864 charges the capacitor C2 so as to pull high the voltage on the source of the transistor M2 to the voltage VP1. When the transistor M1 is turned on, a large current I1 flows therethrough to charge the node N1 and discharge the capacitor C1. Since the current I1 is large, it will quickly change the voltage on the node N1. When the voltage on the node N1 transits to a high level, the transistor M4 is turned on to pull down the voltage on the node N2 to a low level and thereby turn off the transistor M3. When the charges on the capacitor C1 are fully discharged by the current I1, the current source 862 will limit the current I1 flowing through the transistor M1 to be small so as to reduce power consumption. Moreover, since the voltage on the node N1 is at a high level and the voltage on the node N2 is at a low level, the transistor M7 is turned off and the transistor M8 is turned on, so that the node N3 is connected to the voltage source VP2 and the node N4 is connected to the voltage source VS2, thereby asserting a low-level output signal VOUT. Similarly, by proper selection of the capacitances of the capacitors C1 and C2, it is possible to have the capacitor C1 or C2 no more than fully charged when the voltages on the nodes N1 and N2 transit completely, so that the current I1 or I2 changes from large to small.

The current control circuit 86 in the level shift circuit 80 may be replaced by either one of the current control circuits 44, 54 and 64 shown in FIGS. 4 to 6.

It is the node N4 to be used as the output terminal to provide the output signal VOUT and the output signal VOUT is in-phase with the input signal VIN in the previously illustrated embodiments; whereas in other embodiments, it may alternatively use the node N3 as the output terminal to provide the output signal VOUT and thus the output signal VOUT will be opposite in phase to the input signal VIN.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A level shift circuit, comprising:
   an input stage having two nodes, responsive to an input signal to turn on a large current to charge or discharge the first node or the second node so as to quickly change the voltage thereon in a transition state, and lower the current in a steady state to reduce power consumption; and
   an output stage coupled to the first and second nodes, operative to assert an output signal according to the voltages on the first and second nodes;
   wherein the input stage includes:
   a first switch operative to electrically connect the second node to a first voltage source when the voltage on the first node is at a first level, and disconnect the second node from the first voltage source when the voltage on the first node is at a second level;
   a second switch operative to electrically connect the first node to the first voltage source when the voltage on the second node is at the first level, and disconnect the first node from the first voltage source when the voltage on the second node is at the second level;
   a third switch operative to electrically connect the first node to a second voltage source and thereby turn on a first current as the large current when the input signal is at a third level, and disconnect the first node from the second voltage source when the input voltage is at a fourth level;
   a fourth switch operative to electrically connect the second node to the second voltage source and thereby turn on a second current as the large current when the input signal is at the fourth level, and disconnect the second node from the second voltage source when the input voltage is at the third level; and
   a current control circuit operative to lower the first current or the second current in the steady state, the current control circuit including:
   a first capacitor connected between the third switch and the second voltage source, being quickly charged by the first current when the input signal transits to the third level;
   a first small current source connected in parallel with the first capacitor, to limit the first current to be small when the first capacitor is saturated and to discharge the first capacitor when the input signal transits to the fourth level;
   a second capacitor connected between the fourth switch and the second voltage source, being quickly charged by the second current when the input signal transits to the fourth level; and a second small current source connected in parallel with the second capacitor, to limit the second current to be small when the second capacitor is saturated and to discharge the second capacitor when the input signal transits to the third level.

2. The level shift circuit of claim 1, wherein the output stage comprises:
a fifth switch connected between an output terminal and a third voltage source; and
a sixth switch connected between the output terminal and a fourth voltage source, wherein the fifth and sixth switches are switched according to the voltages on the first and second nodes so as to generate the output signal on the output terminal.

3. The level shift circuit of claim 1, further comprising a voltage clamp circuit operative to clamp the voltages on the first and second nodes not to be lower than a threshold.

4. The level shift circuit of claim 3, wherein the voltage clamp circuit comprises:
a first transistor configured as a diode connected between the first node and the first voltage source; and
a second transistor configured as a diode connected between the second node and the first voltage source.

5. The level shift circuit of claim 1, wherein the current control circuit further comprises a fifth switch connected in parallel with the first capacitor, to establish a discharge path to quickly discharge the first capacitor.

6. The level shift circuit of claim 1, wherein the current control circuit further comprises a fifth switch connected in parallel with the second capacitor, to establish a discharge path to quickly discharge the second capacitor.

7. A level shift circuit, comprising:
an input stage having two nodes, responsive to an input signal to turn on a large current to charge or discharge the first node or the second node so as to quickly change the voltage thereon in a transition state, and lower the current in a steady state to reduce power consumption; and
an output stage coupled to the first and second nodes, operative to assert an output signal according to the voltages on the first and second nodes;
wherein the input stage includes:
a first switch operative to electrically connect the second node to a first voltage source when the voltage on the first node is at a first level, and disconnect the second node from the first voltage source when the voltage on the first node is at a second level;
a second switch operative to electrically connect the first node to the first voltage source when the voltage on the second node is at the first level, and disconnect the first node from the first voltage source when the voltage on the second node is at the second level;
a third switch operative to electrically connect the first node to a second voltage source and thereby turn on a first current as the large current when the input signal is at a third level, and disconnect the first node from the second voltage source when the input voltage is at a fourth level;
a fourth switch operative to electrically connect the second node to the second voltage source and thereby turn on a second current as the large current when the input signal is at the fourth level, and disconnect the second node from the second voltage source when the input voltage is at the third level; and
a current control circuit operative to lower the first current or the second current in the steady state, the current control circuit including:

a first capacitor connected between the third switch and the second voltage source, being quickly charged by the first current when the input signal transits to the third level;
a first resistor connected in parallel with the first capacitor, to limit the first current to be small when the first capacitor is saturated and to discharge the first capacitor when the input signal transits to the fourth level;
a second capacitor connected between the fourth switch and the second voltage source, being quickly charged by the second current when the input signal transits to the fourth level; and
a second resistor connected in parallel with the second capacitor, to limit the second current to be small when the second capacitor is saturated and to discharge the second capacitor when the input signal transits to the third level.

8. The level shift circuit of claim 7, wherein the current control circuit further comprises a fifth switch connected in parallel with the first capacitor, to establish a discharge path to quickly discharge the first capacitor.

9. The level shift circuit of claim 7, wherein the current control circuit further comprises a fifth switch connected in parallel with the second capacitor, to establish a discharge path to quickly discharge the first capacitor.

10. A level shift circuit, comprising:
an input stage having two nodes, responsive to an input signal to turn on a large current to charge or discharge the first node or the second node so as to quickly change the voltage thereon in a transition state, and lower the current in a steady state to reduce power consumption; and
an output stage coupled to the first and second nodes, operative to assert an output signal according to the voltages on the first and second nodes;
wherein the input stage includes:
a first switch operative to electrically connect the second node to a first voltage source when the voltage on the first node is at a first level, and disconnect the second node from the first voltage source when the voltage on the first node is at a second level;
a second switch operative to electrically connect the first node to the first voltage source when the voltage on the second node is at the first level, and disconnect the first node from the first voltage source when the voltage on the second node is at the second level;
a third switch operative to electrically connect the first node to a second voltage source and thereby turn on a first current as the large current when the input signal is at a third level, and disconnect the first node from the second voltage source when the input voltage is at a fourth level;
a fourth switch operative to electrically connect the second node to the second voltage source and thereby turn on a second current as the large current when the input signal is at the fourth level, and disconnect the second node from the second voltage source when the input voltage is at the third level; and
a current control circuit operative to lower the first current or the second current in the steady state, the current control circuit including:
a first small current source connected between the third switch and the second voltage source;
a fifth switch connected in parallel with the first current source;
a second small current source connected between the fourth switch and the second voltage source; and a sixth switch connected in parallel with the second current source;

wherein the first small current source limits the first current to be small when the input signal is at the third level and the fifth switch is turned off, and the second small current source limits the second current to be small when the input signal is at the fourth level and the sixth switch is turned off.

* * * * *